US009379668B1

(12) United States Patent
Lerdworatawee et al.

(10) Patent No.: US 9,379,668 B1
(45) Date of Patent: Jun. 28, 2016

(54) ENVELOPE TRACKING CIRCUITS AND METHODS WITH ADAPTIVE SWITCHING FREQUENCY

(71) Applicant: QUALCOMM Incorporated, San Diego, CA (US)

(72) Inventors: Jongrit Lerdworatawee, Santee, CA (US); Song Shi, San Diego, CA (US); Lennart Karl-Axel Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/675,424

(22) Filed: Mar. 31, 2015

(51) Int. Cl.
H03F 1/30 (2006.01)
H03F 1/02 (2006.01)
H03F 3/21 (2006.01)

(52) U.S. Cl.
CPC ............ *H03F 1/0216* (2013.01); *H03F 3/211* (2013.01); *H03F 2200/102* (2013.01); *H03F 2200/453* (2013.01); *H03F 2200/78* (2013.01)

(58) Field of Classification Search
CPC .................................... H03F 1/30; H03F 3/04
USPC .......................................... 330/297, 285, 296
See application file for complete search history.

(56) References Cited

U.S. PATENT DOCUMENTS

| 7,898,327 | B2* | 3/2011 | Nentwig | H03F 1/0227 330/136 |
| 8,902,002 | B2* | 12/2014 | Fagg | H03F 1/0266 330/127 |
| 8,909,175 | B1* | 12/2014 | McCallister | H04L 27/368 330/127 |
| 8,975,960 | B2* | 3/2015 | Strange | H03F 1/0222 330/127 |
| 2009/0289720 | A1 | 11/2009 | Takinami et al. | |
| 2013/0194979 | A1 | 8/2013 | Levesque | |
| 2014/0184336 | A1 | 7/2014 | Nobbe et al. | |
| 2014/0210550 | A1 | 7/2014 | Mathe et al. | |
| 2014/0306769 | A1 | 10/2014 | Khlat et al. | |
| 2014/0315504 | A1 | 10/2014 | Sakai et al. | |
| 2014/0361837 | A1 | 12/2014 | Strange et al. | |
| 2015/0194936 | A1* | 7/2015 | Inanoglu | H03F 1/0222 330/291 |

\* cited by examiner

*Primary Examiner* — Henry Choe
(74) *Attorney, Agent, or Firm* — Fountainhead Law Group P.C.

(57) ABSTRACT

The present disclosure includes envelope tracking circuits and methods with adaptive switching frequency. In one embodiment, a circuit comprising an amplifier to receive an envelope tracking signal having an envelope tracking frequency and output voltage and current to a power supply terminal of a power amplifier circuit. A programmable comparator receives an output signal from the amplifier and generates a switching signal having a switching frequency. A switching regulator stage receives the switching signal and outputs a switching current to the power supply terminal. A frequency comparison circuit configures the programmable comparator based on the envelope tracking frequency and the switching frequency so that the switching frequency tracks the envelope tracking frequency.

20 Claims, 4 Drawing Sheets

ENVELOPE TRACKING CIRCUITS AND METHODS WITH ADAPTIVE SWITCHING FREQUENCY

BACKGROUND

The present disclosure relates to electronic circuits and methods, and in particular, to envelope tracking circuits and methods with adaptive switching frequency.

Envelope Tracking (ET) is a technique aimed at boosting the efficiency of a power amplifier (PA) by continuously adjusting its power supply voltage according to a signal envelope to improve efficiency during transmission. FIG. 1 shows an example configuration for one type of envelope tracking system. In this example, an input signal Vin is provided at the input of a power amplifier (PA) 103 to produce a power amplified signal Vout. PA 103 receives a power supply voltage Vdd and a power supply current Idd from a configuration of a linear amplifier 101 and a switching stage 102. The linear and switching stages work together to adjust the level of Vdd based on the envelope of Vin so that PA 103 operates in a more efficiency region of operation. In this example, linear amplifier 101 receives an envelope tracking signal (ET) representing the envelope of Vin, for example. Linear amplifier 101 may produce a voltage Vdd and current Iamp. Switching stage 102 receives a switching signal SW based on the envelope signal. In this example, SW is generated by sensing Iamp. Switching stage 102 produces a voltage Vdd and current Isw. The sum of currents Iamp and Isw are the power supply current Idd drawn by PA 103. The switching regulator stage 102 boosts the ET's efficiency but it is noisy. The linear regulator stage 101 is higher speed and ensures the optimum power supply voltage to achieve the PA's peak efficiency, but it is (power) lossy. Unfortunately, the noise and efficiency are the contradictory performance requirements.

Obtaining power-efficiency and noise performance across a wide bandwidth range of an envelope waveform is a challenge for conventional envelope tracking amplifiers.

SUMMARY

The present disclosure includes envelope tracking circuits and methods with adaptive switching frequency. In one embodiment, a circuit comprising an amplifier to receive an envelope tracking signal having an envelope tracking frequency and output voltage and current to a power supply terminal of a power amplifier circuit. A programmable comparator receives an output signal from the amplifier and generates a switching signal having a switching frequency. A switching regulator stage receives the switching signal and outputs a switching current to the power supply terminal. A frequency comparison circuit configures the programmable comparator based on the envelope tracking frequency and the switching frequency so that the switching frequency tracks the envelope tracking frequency.

The following detailed description and accompanying drawings provide a better understanding of the nature and advantages of the present disclosure.

DETAILED DESCRIPTION

The present disclosure pertains to envelope tracking circuits and methods with adaptive switching frequency. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

In wireless applications, switching frequency is a key parameter to achieve the tradeoff between efficiency and receiver band noise (RXBN). For higher efficiency, it is desired to have the switching frequency as high as possible. For lower noise, it is desired to have the switching frequency much less than the frequency offset between the TX band and the RX band. Features and advantages of the present disclosure include circuits with the capability of tracking the switching frequency at or near the speed of the envelope transient, which may be desired to achieve the optimum switching frequency across a wide range of envelope tracking applications, for example.

Figure 1:
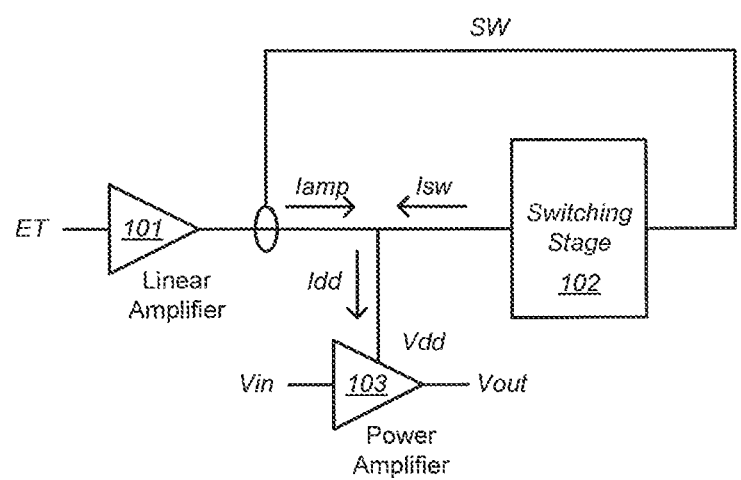
FIG. 1 shows an example configuration for one type of envelope tracking system.
Figure 2:
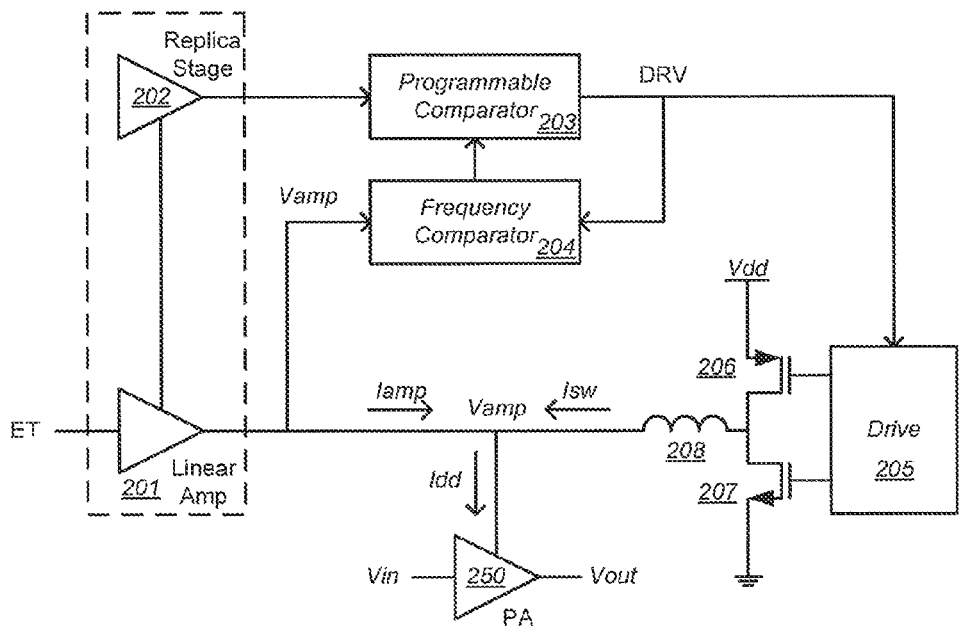
FIG. 2 illustrates an envelope tracking circuit according to one embodiment.

FIG. 2 illustrates an envelope tracking circuit according to one embodiment. In one embodiment, an envelope tracking circuit includes an amplifier 201 (e.g., a linear amplifier) and a switching regulator. Outputs of the amplifier 201 and switching regulator are coupled to a power supply terminal of a power amplifier (PA) circuit 250. In this example, the switching regulator comprises a drive circuit 205, switches 206 and 207 (e.g., a PMOS transistor and NMOS transistor, respectively), and an inductor 208. Amplifier 201 receives an envelope tracking signal (ET) having an envelope tracking frequency and produces an output voltage Vamp and output current Iamp. The switching regulator receives a switching signal DRV (described further below) and produces an output current Isw at the voltage Vamp. Currents Iamp and Isw combine to form a power supply current Idd to power amplifier 250.

Features and advantages of the present disclosure include circuitry to allow the switching frequency of the switching regulator to track changes in the envelope tracking frequency. Embodiments of the present disclosure may include a programmable comparator 203, for example, to receive an output signal from amplifier 201 and generate a switching signal DRV having a switching frequency. DRV, in turn, is provided as an input to drive circuit 205 to activate switching regulator switches 206 and 207 to control switching regulator current Isw. In some embodiments, programmable comparator 203 may detect the direction of the amplifier current Iamp and control the switching regulator accordingly. For example, if Iamp is positive, DRV may configure the switching regulator to turn PMOS transistor 206 ON and turn NMOS transistor 207 OFF so that Isw increases. As Isw increases, Iamp may decrease. Accordingly, when Iamp changes direction, DRV may change state and configure the switching regulator to turn PMOS transistor 206 OFF and turn NMOS transistor 207 ON so that Isw decreases. Vamp on the other hand tracks the ET signal. Accordingly, current Iamp provided by a high speed amplifier 201 may ensure that Vamp tracks the ET signal, and supplemental current Isw may be provided by the switching stage to improve the efficiency of the system.

Programmable comparator 203 may further control the switching frequency of switching signal DRV. Accordingly, features and advantages of the present disclosure include adjusting the programmable comparator 203 to dynamically change the switching frequency of DRV. For example, a frequency comparison circuit 204 may receive a first signal having the envelope tracking frequency and a second signal having the switching frequency. In this example, frequency comparison circuit 204 is coupled to an output of amplifier 201 to receive Vamp (at the envelope tracking frequency) and further coupled to an output of programmable comparator 203 to receive the switching signal DRV (at the switching frequency). Frequency comparison circuit 204 configures the programmable comparator 203 based on the envelope tracking frequency, Fet, and the switching frequency, Fsw, so that the switching frequency tracks the envelope tracking frequency. For example, according to one method, frequency comparison circuit 204 may change a hysteresis window (e.g., trip points) of the programmable comparator, which may change the switching frequency. In one embodiment, frequency comparison circuit 204 increases the hysteresis window of the programmable comparator as the envelope tracking frequency decreases, and frequency comparison circuit 204 decreases the hysteresis window of the programmable comparator as the envelope tracking frequency increases. When the hysteresis window is increased, the switching frequency of DRV may decrease and be at a lower frequency. Conversely, when the hysteresis window is decreased, the switching frequency of DRV may increase and be at a higher frequency. In one embodiment described in more detail below, frequency comparison circuit 204 alternately increases and decreases the hysteretic window during a plurality of time periods to change the switching frequency of the switching signal. A variety of techniques may be used to implement and adjust hysteresis (trip points) in a comparison circuit, including setting thresholds or offsets inside the comparator. An example of a programmable comparator according to one embodiment is provided below.

Features and advantages of some embodiments further include a replica stage 202. For example, the amplifier may comprise a replica output stage 202. In this example, programmable comparator 203 is coupled to an output of the replica output stage 202. Current, Iamp, from the amplifier 201 to the power supply terminal of the PA may be replicated in replica output stage 202 to produce a replica current to the input of the programmable comparator 203. One advantage of this approach is that the replica output stage may use less current and no additional sense resistor so that less power is dissipated to sense the direction of Iamp, for example.

Figure 3:
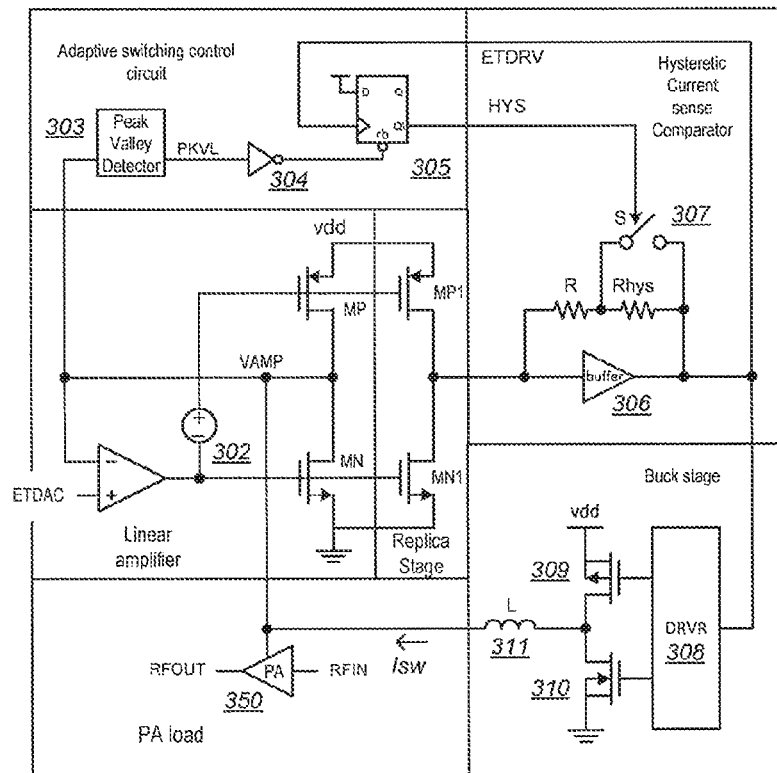
FIG. 3 illustrates an example envelope tracking circuit according to another embodiment.

FIG. 3 illustrates an example envelope tracking circuit according to another embodiment. An envelope tracking signal ETDAC is received in linear amplifier 301 on a positive input terminal. ETDAC may be generated by a digital-to-analog converter, for example. Linear amplifier 301 includes an output stage and a replica output stage. The output stage comprises a voltage level shift circuit 302, PMOS output transistor MP, and NMOS output transistor MN. A negative input of amplifier 301 is coupled to the output in a unity gain configuration so that output voltage VAMP tracks ETDAC. Voltage Vamp is generated on the node between the drains of MP and MN, and is coupled to the power supply terminal of power amplifier (PA) 350. Replica output stage comprises PMOS transistor MP1 and NMOS transistor MN1. The gate of MP1 is coupled to the gate of MP and the gate of MN1 is coupled to the gate of MN so that current flowing in the replica stage is substantially the same as the current flowing in the output stage. In one embodiment, MP1 and MN1 are a fraction of the size of the MP and MN, respectively (e.g., 1:N) so that current in the replica stage is a fraction of the current in the output stage.

In this example, the output of the replica stage is coupled to a programmable comparator comprising a buffer 306, one or more switches 307, and a plurality of resistive components R and Rhys configured in series between the buffer input and the buffer output. The buffer may comprise a plurality of CMOS inverter circuits in series, for example. An input of the buffer is coupled to the output of the replica stage to receive the output signal, which in this example is a scaled down version of Iamp. The operation of the buffer and feedback resistor is as follows. Assuming Iamp transitions from negative to positive, the input of buffer 306 prior to the transition will be low and the output of the buffer, which is the switching signal ETDRV, will also be low. Thus, the output of the buffer couples the feedback resistor at the buffer output to ground. As Iamp goes positive, the currents through MP and MP1 increase and is greater than the currents through MN and MN1. The current through MP1 drives the feedback resistor at the input and the voltage begins to increase. When the current through MP1 produces a sufficient voltage at the input of the buffer to trip the output, the buffer will switch states, the input and output of the buffer will both be high, and the switching signal ETDRV will go high. ETDRV going high turns switching stage transistor 309 ON and transistor 310 OFF, which causes Isw to ramp up (where Isw is the current from the switching stage and may also be referred to at the inductor current IL). VAMP remains at the ETDAC value due to the unity gain configuration of amplifier 301.

As Isw ramps up, Iamp will start to ramp down to maintain a particular level of VAMP and Idd. As Isw continues to increase, Iamp switches from positive to negative. Now, the input of buffer 306 will be high and the output of the buffer will also be high. Thus, the output of the buffer now couples the feedback resistor at the output to high (to Vdd, for example). As Iamp goes negative, the current through MP and MP1 decreases and the current through MN and MN1 increases. The current through MN1 sinks current through the feedback resistor at the buffer input and the voltage begins to decrease. When the current through MN1 produces a sufficient voltage drop at the input of the buffer to trip the output, the buffer will switch states, the input and output of the buffer will both be low again, and the switching signal ETDRV will go low. ETDRV going low turns switching stage transistor 309 OFF and transistor 310 ON, which causes Isw to ramp down.

One or more switches, such as switch 307, are configured in parallel with the resistive components to selectively change the resistance between the buffer input and the buffer output to adjust the trip point of the buffer. For example, if switch 307 is closed, the resistance Rhys is shorted and the feedback resistance is smaller. A smaller feedback resistance increases the hysteresis window because more current is required from the replica stage to trip the buffer. The extra time required to overcome the additional hysteresis and trip the buffer reduces the switching frequency of the switching signal. Thus, decreased feedback resistance causes an increase to the hysteresis and decrease in the switching frequency. On the other hand, if switch 307 is open, the resistance Rhys is in series with resistance R and the feedback resistance is larger. A larger feedback resistance decreases the hysteresis window because less current is required from the replica stage to trip the buffer. The reduced time required to overcome the lower hysteresis and trip the buffer increases the switching frequency of the switching signal. Thus, increased feedback resistance causes a decrease to the hysteresis and increase in the switching frequency.

The above example illustrates one example technique of changing a hysteresis window of the programmable comparator to change the switching frequency. The present example illustrates the circuit with two resistors and one switch, but it is to be understood that more resistive components (e.g., more resistor taps) and more switches could be used. Other equivalent implementations may use an analog technique for adjusting a resistance to change trip points, for example. Analog and digital techniques may also adjust thresholds or offsets for adjusting trip points according to other embodiments.

In this example, frequency tracking is performed by a frequency comparison circuit that adjusts the feedback resistance of buffer 306 digitally. For example, an adaptive switching control circuit may include a peak-valley detector 303 having an input coupled to the output of the amplifier 301 to receive VAMP. The peak-valley detector 303 generates a signal having the envelope tracking frequency. The signal may include a pulse, for example, that occurs on peaks and valleys in the envelope tracking signal ET and VAMP, as illustrated below in FIGS. 4 and 5. An output of peak-valley detector 303 is coupled through an inverter 304 to a frequency comparison circuit comprising a flip flop 305 (here, a D-flip flop (DFF)). The PKVL signal embodies the envelope tracking frequency. PKVL is coupled to the reset input of the DFF 305. The switching signal ETDRV embodying the switching frequency is coupled to the clock input of the DFF, and the D input is coupled high (e.g., to Vdd). In this example, the Qbar output (HYS) is coupled to switch 307 to control the hysteresis of comparator, and thus increase or decrease the switching frequency.

Figure 4:
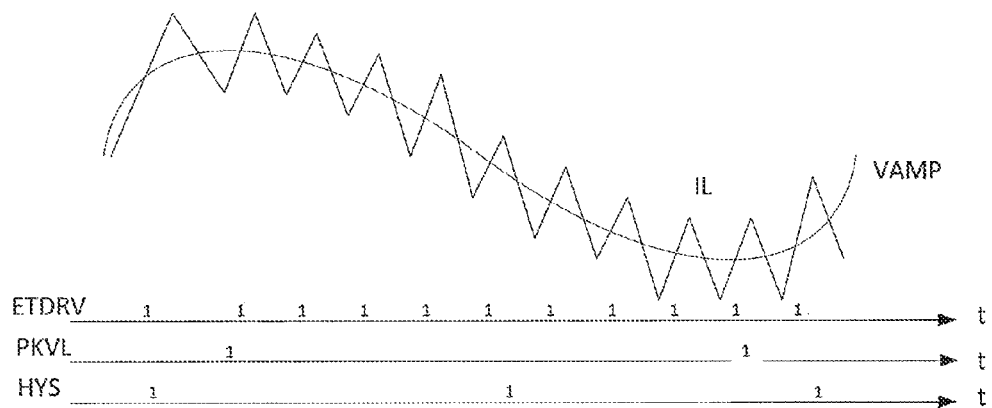
FIG. 4 illustrates example waveforms for an envelope tracking circuit according to one embodiment.
Figure 5:
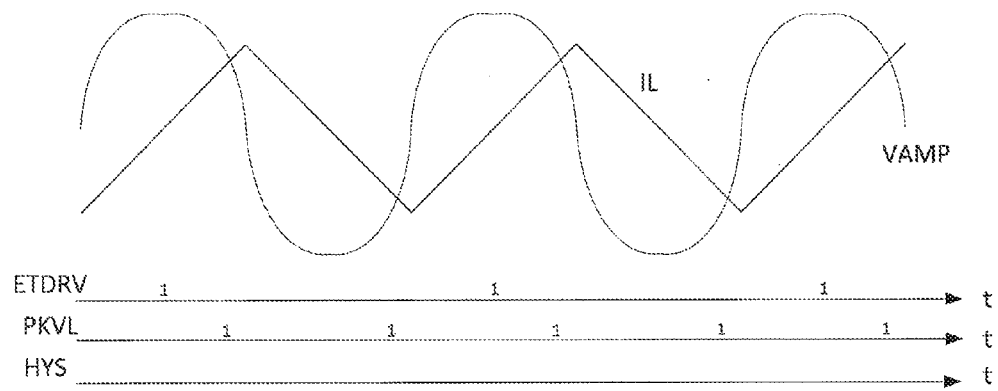
FIG. 5 illustrates example waveforms for an envelope tracking circuit according to one embodiment.

The operation of the frequency comparison circuit and frequency tracking can be understood with reference to FIGS. 4 and 5. FIG. 4 illustrates example waveforms for an envelope tracking circuit according to one embodiment. Here, the envelope tracking frequency, embodied by VAMP, is less than the switching frequency, embodied by inductor current IL. In this example, PKVL is a pulse occurring on the peak and valley of VAMP. Envelope tracking frequency signal PKVL and switching frequency signal ETDRV are compared in the DFF and used to open and close switches in the feedback resistance to change the switching frequency. The Qbar output of DFF is HYS. HYS=0 corresponds to the switch being open, which sets a large resistance and increases the switching frequency. HYS=1 corresponds to the switch being closed, which sets a lower resistance and decreases the switching frequency. PKVL resets the DFF (Qbar=HYS=1), and ETDRV clocks a 1 to the output (Qbar=HYS=0). Thus, on each cycle HYS is set to 0 and the switching frequency is increased for a time and then HYS is set to 1 and the switching frequency is decreased for a time to produce an average switching frequency. This averaging technique is one example mechanism for alternately increasing and decreasing the hysteretic window during a plurality of time periods to change the switching frequency of the switching signal, for example. When the envelope tracking frequency is less than the switching signal frequency, HYS will be 1 for a longer period of time corresponding to the frequency difference between the envelope tracking frequency and the switching signal. As this frequency different decreases (e.g., the envelope frequency increases), the time average between the alternating states of the hysteretic window (e.g., HYS=1 and HYS=0 described above) will cause the switching frequency to increase as the envelope frequency increases. The switching frequency thus tracks the envelope frequency.

FIG. 5 illustrates example waveforms for an envelope tracking circuit according to one embodiment. Here, the envelope tracking frequency, embodied by VAMP, is approximately equal to the switching frequency, embodied by inductor current IL. Accordingly, the frequency of PKVL has increased. In this example, the frequency of PKVL at the reset input of the DFF prevents ETDRV from changing the DFF output state. HYS is held at 0, switch 307 remains open, resulting in a large feedback resistance, a small hysteretic window, and higher switching frequency for ETDRV.

Figure 6:
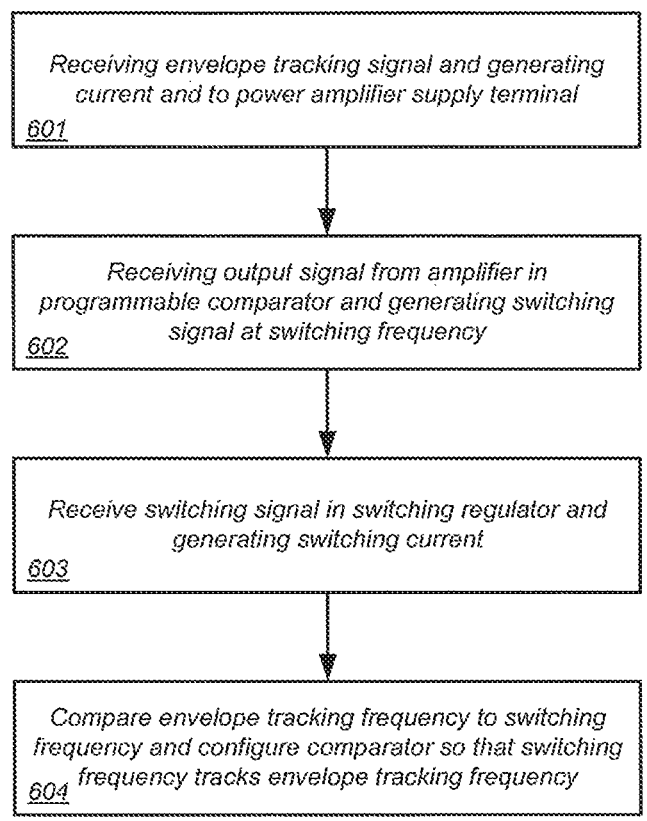
FIG. 6 illustrates a method for adapting a switching frequency according to one embodiment.

FIG. 6 illustrates a method for adapting a switching frequency according to one embodiment. At 601, an envelope tracking signal having an envelope tracking frequency is received in an amplifier. The amplifier generates a current and a power supply voltage to a power supply terminal of a power amplifier circuit. At 602, an output signal from the amplifier is received in a programmable comparator. The programmable comparator generates a switching signal having a switching frequency. At 603, the switching signal is received in a switching regulator, and the switching regulator generates a switching current to the power supply terminal of the power amplifier circuit. At 604, frequencies of a first signal having the envelope tracking frequency and a second signal having the switching frequency are compared. The programmable comparator is configured based on the envelope tracking frequency and the switching frequency so that the switching frequency tracks the envelope tracking frequency.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims Based on the above disclosure and the following claims, other arrangements, embodiments, implementations and equivalents may be employed without departing from the scope of the present disclosure as defined by the claims.

What is claimed is:

1. A circuit comprising:
   an amplifier to receive an envelope tracking signal having an envelope tracking frequency, the amplifier comprising an output coupled to a power supply terminal of a power amplifier circuit;
   a programmable comparator having an input to receive an output signal from the amplifier, the programmable comparator generating a switching signal having a switching frequency;
   a switching regulator stage to receive the switching signal, the switching regulator stage comprising an output coupled to the output of the amplifier and the power supply terminal; and
   a frequency comparison circuit to receive a first signal having the envelope tracking frequency and a second signal having the switching frequency, wherein the frequency comparison circuit configures the programmable comparator based on the envelope tracking frequency and the switching frequency so that the switching frequency tracks the envelope tracking frequency.

2. The circuit of claim 1 wherein the frequency comparison circuit changes a hysteresis window of the programmable comparator.

3. The circuit of claim 2 wherein the frequency comparison circuit increases the hysteresis window of the programmable comparator as the envelope tracking frequency decreases and decreases the hysteresis window of the programmable comparator as the envelope tracking frequency increases.

4. The circuit of claim 2 wherein the frequency comparison circuit alternately increases and decreases the hysteretic window during a plurality of time periods to change the switching frequency of the switching signal.

5. The circuit of claim 1 wherein the amplifier comprises a replica output stage, and wherein the input of the programmable comparator is coupled to an output of the replica output stage, wherein a current from the amplifier to the power supply terminal is replicated in the replica output stage to produce a replica current to the input of the programmable comparator.

6. The circuit of claim 5 wherein the amplifier comprises an output stage comprising a first PMOS transistor and a first NMOS transistor configured in series, and wherein the replica output stage comprises a second PMOS transistor and a second NMOS transistor configured in series, wherein a gate of the first PMOS transistor is coupled to a gate of the second PMOS transistor and a gate of the first NMOS transistor is coupled to a gate of the second NMOS transistor.

7. The circuit of claim 6 wherein the second PMOS transistor and the second NMOS transistor are a fraction of the size of the first PMOS transistor the first NMOS transistor.

8. The circuit of claim 1 wherein the programmable comparator comprises:
a buffer having an input to receive the output signal from the amplifier and an output for providing the switching signal;
one or more switches; and
a plurality of resistive components configured in series between the buffer input and the buffer output,
wherein the one or more switches are configured in parallel with one or more resistive components to selectively change a resistance between the buffer input and the buffer output.

9. The circuit of claim 8 wherein the buffer comprises a plurality of inverter circuits in series.

10. The circuit of claim 8 wherein the switching frequency increases as the resistance increases, and wherein the switching frequency decreases as the resistance decreases.

11. The circuit of claim 1 wherein the frequency comparison circuit comprises a flip flop.

12. The circuit of claim 1 further comprising a peak-valley detector having an input coupled to the output of the amplifier, the peak-valley detector generating the first signal having the envelope tracking frequency.

13. A method comprising:
receiving an envelope tracking signal having an envelope tracking frequency in an amplifier, and in accordance therewith, generating a power supply voltage and a first current to a power supply terminal of a power amplifier circuit;
receiving an output signal from the amplifier in a programmable comparator, and in accordance therewith, generating a switching signal having a switching frequency;
receiving the switching signal in a switching regulator stage, and in accordance therewith, generating a switching current to the power supply terminal of the power amplifier circuit; and
comparing frequencies of a first signal having the envelope tracking frequency and a second signal having the switching frequency, and in accordance therewith, configuring the programmable comparator based on the envelope tracking frequency and the switching frequency so that the switching frequency tracks the envelope tracking frequency.

14. The method of claim 13 further comprising changing a hysteresis window of the programmable comparator based on said comparing.

15. The method of claim 14 wherein the hysteresis window of the programmable comparator is increased as the envelope tracking frequency decreases and the hysteresis window of the programmable comparator is decreased as the envelope tracking frequency increases.

16. The method of claim 14 further comprising alternately increasing and decreasing the hysteretic window during a plurality of time periods to change the switching frequency of the switching signal.

17. The method of claim 13 further comprising generating a replica current in a replica output stage of the amplifier at the input of the programmable comparator.

18. The method of claim 13 wherein the programmable comparator comprises a buffer, one or more switches, and a plurality of resistive components configured in series between the buffer input and the buffer output, and wherein the one or more switches are configured in parallel with one or more resistive components to selectively change a resistance between the buffer input and the buffer output.

19. A circuit comprising:
an amplifier to receive an envelope tracking signal having an envelope tracking frequency, the amplifier comprising an output coupled to a power supply terminal of a power amplifier circuit;
programmable comparator means for generating a switching signal having a switching frequency based on an output signal from the amplifier;
a switching regulator stage to receive the switching signal, the switching regulator stage comprising an output coupled to the output of the amplifier and the power supply terminal; and
a frequency comparison circuit to receive a first signal having the envelope tracking frequency and a second signal having the switching frequency, wherein the frequency comparison circuit configures the programmable comparator based on the envelope tracking frequency and the switching frequency so that the switching frequency tracks the envelope tracking frequency.

20. The circuit of claim 19 wherein the frequency comparison circuit comprises means for comparing the envelope tracking frequency and the switching frequency and configuring the programmable comparator means.

\* \* \* \* \*